United States Patent [19]

Seki et al.

[11] Patent Number: 5,129,986

[45] Date of Patent: Jul. 14, 1992

[54] METHOD FOR CONTROLLING SPECIFIC RESISTANCE OF SINGLE CRYSTAL AND AN APPARATUS THEREFOR

[75] Inventors: Hidetoshi Seki, Takasaki; Seiichiro Ohtsuka, Tomioka; Masahiko Baba, Annaka, all of Japan

[73] Assignee: Shin-Etsu Handotai Co., Ltd., Tokyo, Japan

[21] Appl. No.: 614,587

[22] Filed: Nov. 16, 1990

[30] Foreign Application Priority Data

Nov. 16, 1989 [JP] Japan ................................. 1-296151

[51] Int. Cl.$^5$ .............................................. C30B 15/20
[52] U.S. Cl. ....................................... 156/601; 156/605; 156/606; 156/617.1; 156/618.1; 156/620.4; 422/249
[58] Field of Search ............ 156/601, 605, 606, 617.1, 156/618.1, 620.4; 422/249

[56] References Cited

U.S. PATENT DOCUMENTS

| | | | |
|---|---|---|---|
| 3,342,560 | 9/1967 | Eckardt et al. | 156/601 |
| 3,556,732 | 1/1971 | Chang et al. | 422/249 |
| 4,400,232 | 8/1983 | Ownby et al. | 156/601 |
| 4,956,153 | 9/1990 | Yamagishi et al. | 156/617.1 |

FOREIGN PATENT DOCUMENTS

| | | | |
|---|---|---|---|
| 373899 | 6/1990 | European Pat. Off. | 422/249 |
| 59-30792 | 2/1984 | Japan | 422/249 |
| 61-227986 | 10/1986 | Japan | 156/620.4 |
| 63-270390 | 11/1988 | Japan | 156/601 |

*Primary Examiner*—Robert Kunemund
*Attorney, Agent, or Firm*—Whitham & Marhoefer

[57] ABSTRACT

A method for controlling a specific resistance of a single crystal in a Czochralski-method type single crystal pulling apparatus having a hermetical chamber in which the single crystal is pulled up from a polycrystal melt and an inert gas supply and exhaust system by means of which an inert gas is supplied to the hermetical chamber and exhausted therefrom; the method being characterized in that the pneumatic pressure in the hermetical chamber and the supply rate of the inert gas are controlled in accordance with a prepared control pattern with respect to the passage of pulling time.

18 Claims, 4 Drawing Sheets

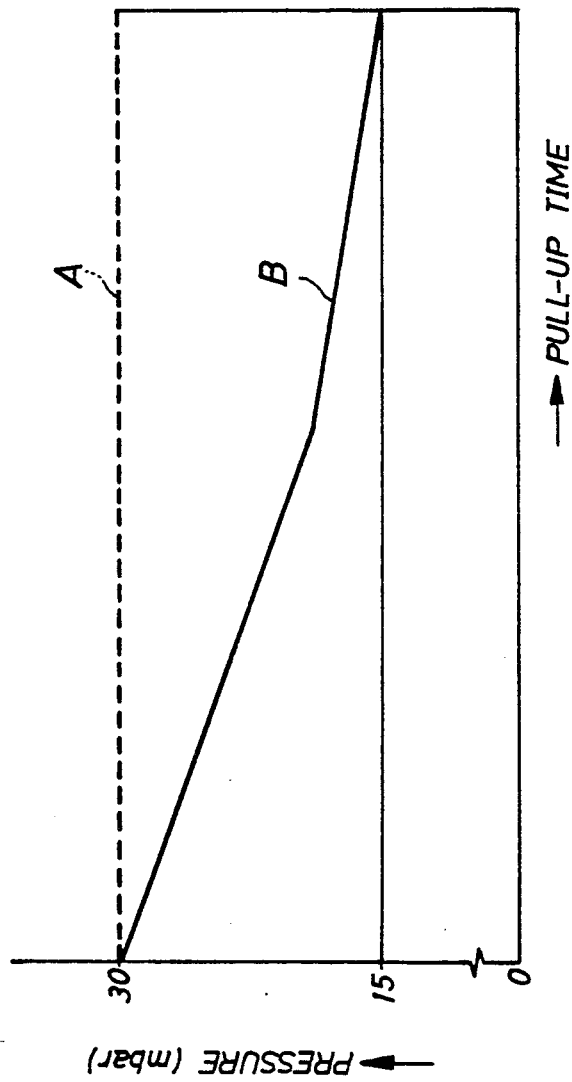

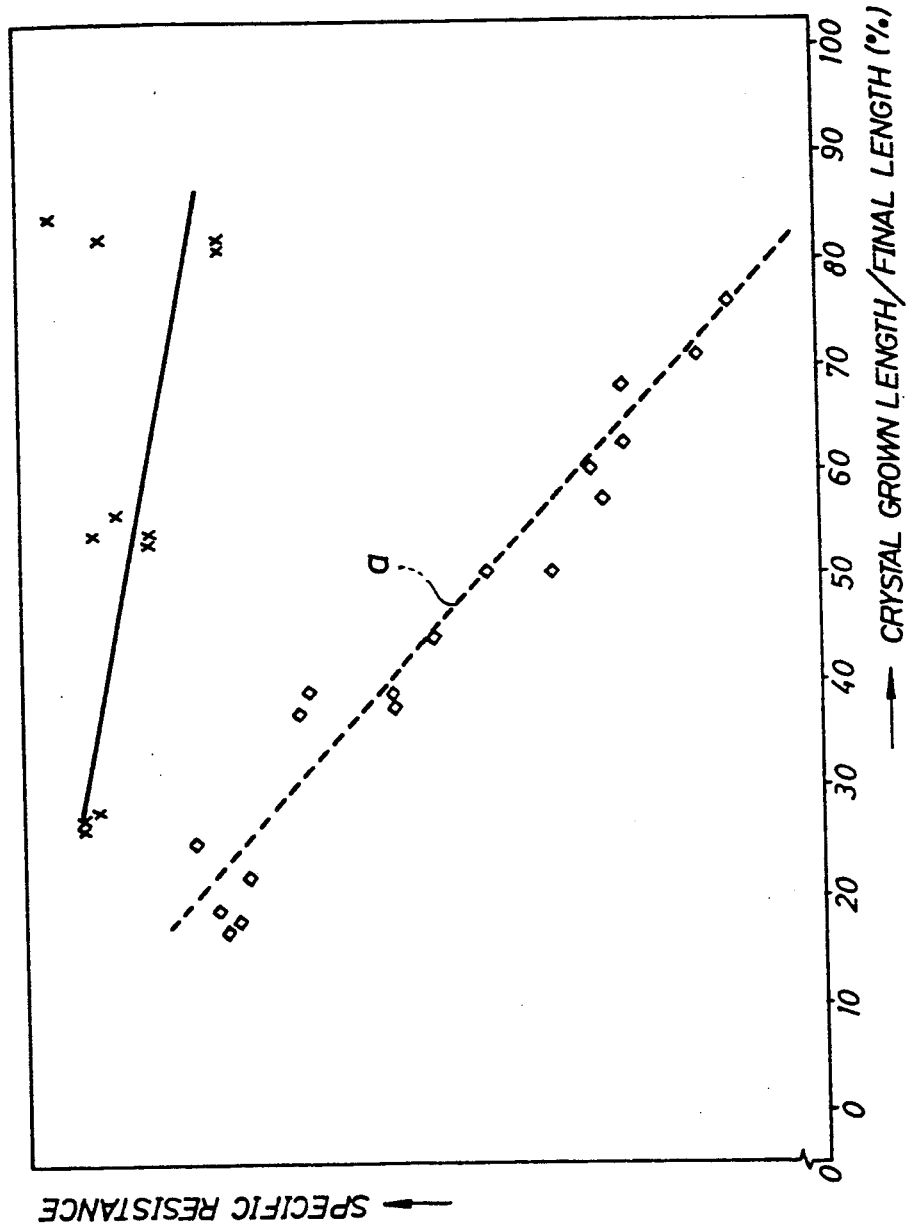

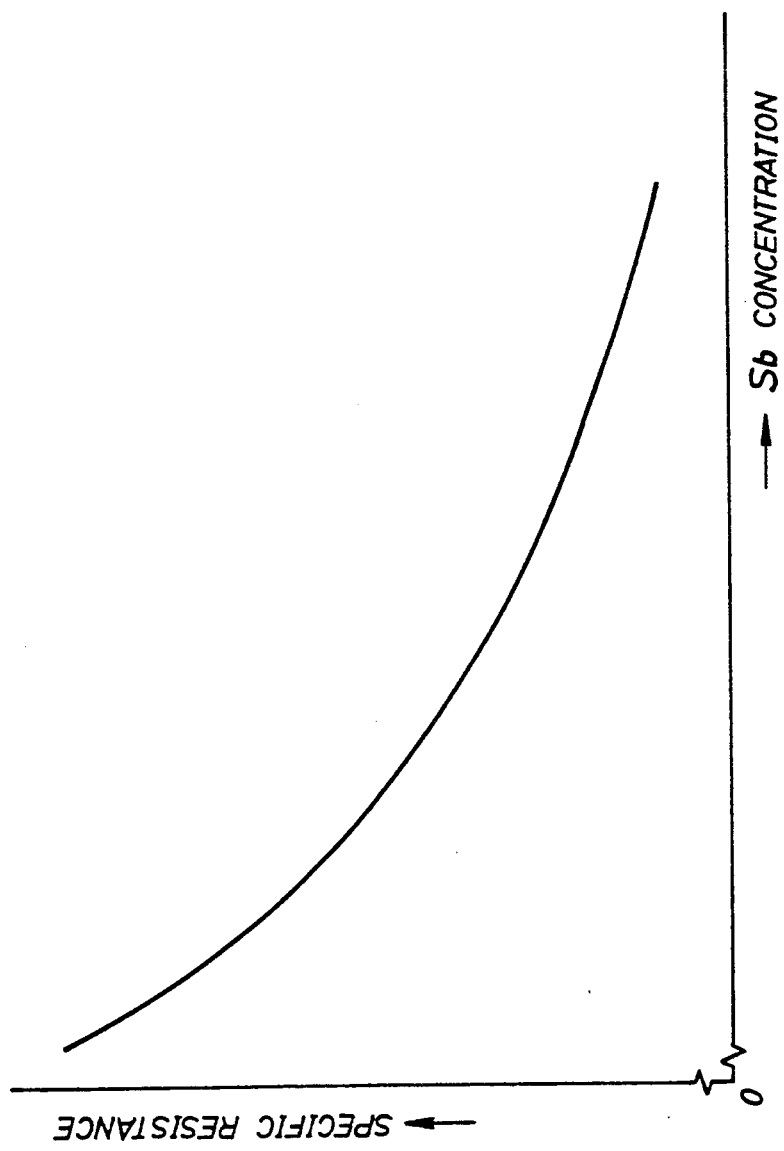

METHOD FOR CONTROLLING SPECIFIC RESISTANCE OF SINGLE CRYSTAL AND AN APPARATUS THEREFOR

This invention relates to a method and an apparatus for controlling the specific resistance of a single crystal ingot (rod) pulled up from a polycrystal melt of a semiconductor substance in Czochralski (CZ) method.

BACKGROUND OF THE INVENTION

For example, with reference to attached FIG. 1, in a CZ method-type single crystal pulling apparatus for growing and raising a single crystal silicon ingot (9) from a polycrystal silicon melt (10), a silicon seed crystal (12) fixed at the lower end of a pull wire (11) (or, alternatively, supported by a pull shaft) is dipped slightly in the silicon melt contained in a quartz crucible (4) provided in a hermetical chamber (2), and is pulled up at a rate while being turned about its axis by means of the pull wire, whereby a growing silicon single crystal rod is raised.

When a material having a high volatility and a small segregation coefficient, such as Sb, is added to the polycrystal melt in the crucible as a dopant, or an impurity, for the purpose of obtaining a doped or impurity semiconductor, e.g. Sb-doped single crystal, an inconvenience is experienced as the single crystal is pulled up and the liquid level of the polycrystal melt lowers in the crucible: that is, since the segregation coefficient of the dopant (Sb) is small, its tendency of entering the growing single crystal is small, and consequently the dopant concentration of the polycrystal melt in the crucible gradually increases as the pulling operation proceeds, so long as the pressure in the chamber is maintained at a constant value (e.g., 30 millibar, as shown by the broken straight line A in FIG. 2) so as to fix the evaporation rate of the dopant throughout the pulling operation.

There exists a relation between the specific resistance of a single crystal and the Sb concentration thereof which is typically represented by the graph of FIG. 4. As the Sb concentration increases, the specific resistance of the single crystal decreases along a curve resembling a hyperbolic curve.

Therefore, as described above, as the single crystal grows longer causing the dopant concentration to increase, that is, as the proportion of the length of the grown crystal to the aimed final length thereof increases (abscissa, %), the specific resistance drops along the broken line a of FIG. 3, and eventually may become lower than the minimum allowable value. Incidentally, in FIG. 3, plotted with a symbol is the actually measured specific resistance.

SUMMARY OF THE INVENTION

This invention was made in view of this problem, and it is, therefore, an object of the invention to provide a method, as well as an apparatus, for controlling the axial specific resistance of a single crystal ingot pulled up from a polycrystal melt of a semiconductor substance in Czochralski (CZ) method with high precision.

More particularly, an object of the invention is to provide a method and an apparatus which enable arbitrary controlling of axial distribution of the specific resistance of the single crystal ingot and thus enable growing of the single crystal ingot in which the specific resistance is within an allowable range throughout the whole length of the ingot.

According to the invention, a method is proposed for controlling a specific resistance of a single crystal which is grown in a Czochralski-method type single crystal pulling apparatus having a hermetical chamber in which the single crystal is pulled up from a polycrystal melt and an inert gas supply and exhaust system by means of which an inert gas is supplied to the hermetical chamber and exhausted therefrom. In this method, the pneumatic pressure in the hermetical chamber and the supply rate of the inert gas are controlled in accordance with a prepared control pattern with respect to the passage of pulling time.

Preferably, the prepared control pattern is such that the pneumatic pressure in the hermetical chamber is varied while the supply rate of the inert gas is kept unchanged.

Or alternatively, the prepared control pattern is such that the supply rate of the inert gas is varied while the pneumatic pressure in the hermetical chamber is kept unchanged.

In an embodiment, the prepared control pattern is obtained by first solving the following partial differential equation for $(\partial P/\partial t)_F$ and $(\partial F/\partial t)_P$ such that $K_{Sb} \approx 1$:

$$K_{Sb} = aP_o + b(\partial P/\partial t)_F + cF_o + d(\partial F/\partial t)_P + e$$

wherein a, b, c, d, e are empirically obtained coefficients, P is the pressure in the chamber, F the inert gas flow rate, t the time passage of the pulling operation, $K_{Sb}$ the segregation coefficient of a Sb dopant in the silicon melt, $P_o$ the initial value of the chamber pressure P, $F_o$ the initial value of the inert gas flow rate F; then, programming the values of the pneumatic pressure P in the chamber and the inert gas flow rate F with respect to the time passage t of the pulling operation.

In another embodiment, the prepared control pattern is obtained by first solving the following partial differential equation for $(\delta P/\delta t)_F$ where the initial flow rate is constant such that $K_{Sb} \approx 1$:

$$K_{Sb} = aP_o + b(\delta P/\delta t)_F + cF_o + e;$$

then, programming the value of the pneumatic pressure P in the chamber with respect to the time passage t of the pulling operation. In still another embodiment the prepared control pattern is obtained by first solving the following partial differential equation for $(\delta F/\delta t)_P$ where the pneumatic pressure is constant in the chamber such that $K_{Sb} \approx 1$:

$$K_{Sb} = aP_o + cF_o + d(\partial F/\partial t)_P + e;$$

then, programming the value of the inert gas flow rate F with respect to the time passage t of the pulling operation.

In another aspect of the invention, an apparatus for controlling a specific resistance of a single crystal is provided which is grown in a Czochralski-method type single crystal pulling apparatus having:
  a hermetical chamber in which the single crystal is pulled up from a polycrystal melt;
  an inert gas system including an inert gas supply source, an inert gas supply passage via which the inert gas supply source communicates with the chamber, an inert gas exhaust passage, and a vacuum pump by means of which an inert gas is supplied to the hermetical chamber and exhausted therefrom;

the apparatus being characterized by comprising:
- a flow rate control means provided across the inert gas supply passage for controlling the supply rate of the inert gas to the hermetical chamber;
- a control valve means provided across the exhaust passage via which the chamber communicates with the vacuum pump, for controlling the pressure in the hermetical chamber;
- a pressure sensor for detecting the pressure in the hermetical chamber; and
- a central processing unit for controlling the control valve means and the flow rate control means responsive to the pressure detected by the pressure sensor in a manner such that the pressure in the chamber and the inert gas flow rate are controlled in accordance with a prepared control pattern with respect to the passage of pulling time.

(Operation)

The evaporation rate of a dopant such as Sb in a polycrystal melt depends on the ambient pressure and time such that the evaporation rate of the dopant increases as the pressure decreases with time, and the dopant concentration of the polycrystal melt is caused to decrease.

According to the invention, it is now possible to regulate the growth of a single crystal rod in a manner such that the specific resistance of the single crystal rod throughout its entire length becomes within a desired range. This regulation is attained by employing the central processing unit to reduce the gas pressure in the chamber of the single crystal pulling apparatus as the pulling operating proceeds, whereby the evaporation rate of the dopant is increased and the dopant concentration of the polycrystal melt is reduced, which in turn checks or moderates the drop in specific resistance of the single crystal, as is clear from FIG. 3; consequently, it is now possible to regulate the specific resistance of the single crystal rod within a desired range throughout its entire length. Also, by increasing the inert gas flow rate to the chamber by employing the flow rate control means, as the pulling operation proceeds, the evaporation rate of the dopant increases and the dopant concentration of the polycrystal melt decreases, whereby the dropping of the specific resistance of the single crystal is checked or moderated, as is clear from FIG. 3; consequently it is also possible to regulate the specific resistance within a tolerable range throughout the whole length of the single crystal.

BRIEF DESCRIPTION OF THE DRAWINGS

These and other objects of the invention will be seen by reference to the description, taken in connection with the accompanying drawings, in which:

FIG. 2 is a graph showing a variation made of a pressure in a chamber with respect to the passage of time;

FIG. 3 is a graph where the measured result of the specific resistance of the single crystal is plotted with respect to the proportion of the length of the grown crystal to the aimed final length thereof; and FIG. 4 is a graph showing a relation between the specific resistance of the single crystal and the Sb concentration thereof.

(EMBODIMENT)

Figure 1:
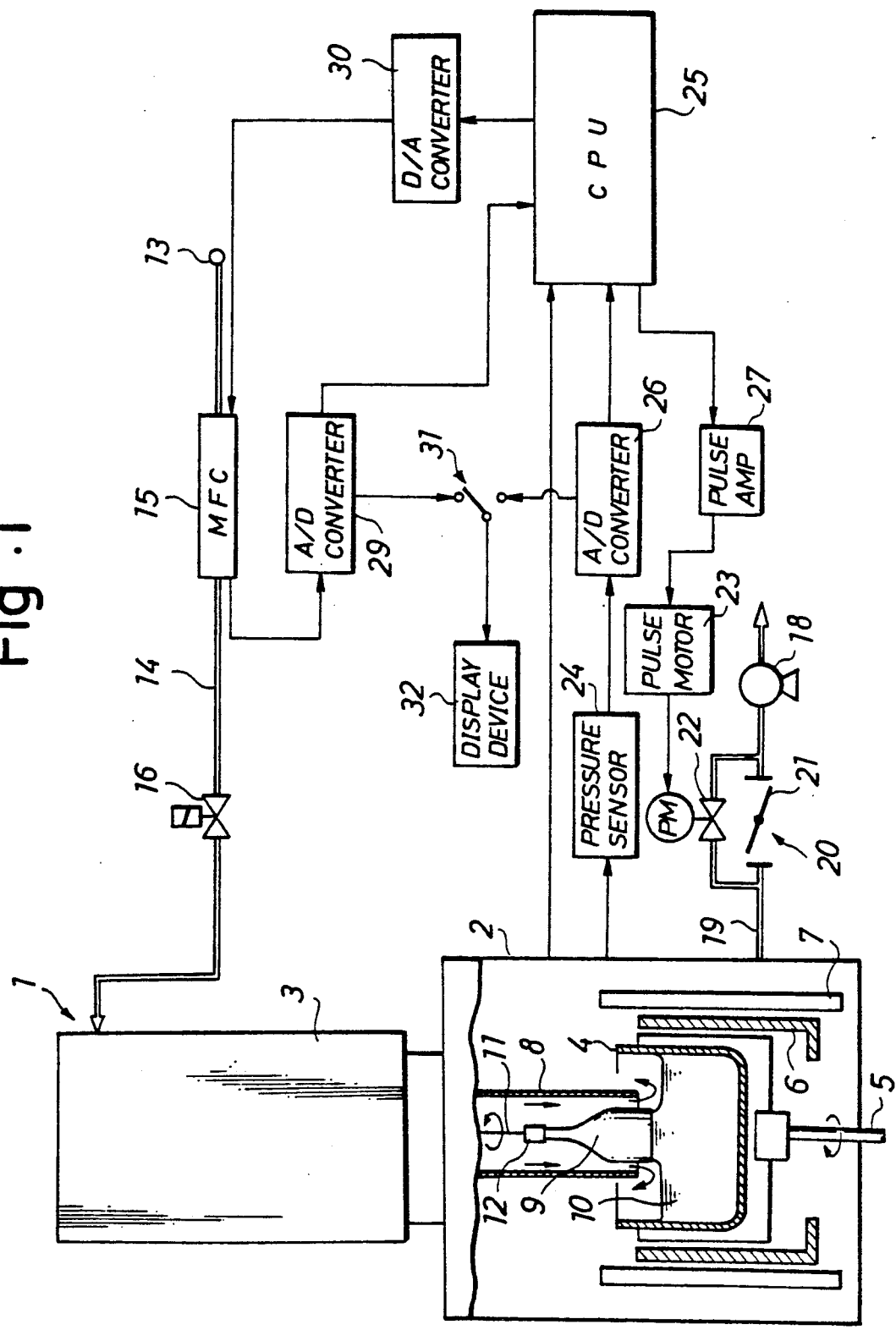
FIG. 1 is a block diagram showing the construction of a specific resistance control apparatus of the invention.

An embodiment of the invention will now be described with reference to the attached drawings.

Reference numeral 1 designates a single crystal pulling apparatus based on CZ method, in which a pull chamber 3 is provided above and in coaxial alignment with the heat chamber 2, both made of a stainless steel. A quartz crucible 4 for containing a semiconductor substance 10 is supported by a support shaft 5 in the chamber 2. The support shaft 5 is adapted to rotate about its axis and shift in the axial direction. If the quartz crucible 4 were always held at the original level, the melt level in the quartz crucible 4 would gradually shift downwards relative to a heater 6 with the growth of a single crystal 9, thus resulting in an instability of the thermal field in the crystal and the melt 10. Therefore, the support shaft 5 is adapted to axially displace the crucible such that the displacement of the melt level (solid-liquid interface) downwards is compensated for by continuous rise of the crucible 4 so that the interface level is stationary relative to the heater 6 during the growing.

Around the heater 6 is provided a cylindrical thermal insulator 7, both made of carbon.

In the upper part of the chamber 2 a purge tube 8 for supplying Ar gas is provided vertically and in coaxial alignment with the growing single crystal 9, which is raised into the purge tube 8. During the single crystal pulling operation, the altitudinal position of the crucible is controlled such that the lower end of the purge tube 8 is always in the upward vicinity of the surface of the melt of the polycrystal Si melt 10.

A seed crystal 12 is fixed at the lower end of a pull wire 11, which hangs within the purge tube 8. The wire 11 is rotated and vertically moved at various rates by means of a drive mechanism, not shown, provided in the upper part of the pull chamber 3.

Argon gas is supplied to the pull chamber 3 and the heat chamber 2 from an argon gas supply source 13, e.g. an gas cylinder, by way of a supply line 14, across which are provided a mass flow controller (MFC) 15 and a valve 16. The MFC 15 is capable of controlling the Ar gas flow rate to a set value.

In this kind of single crystal pulling apparatus, a chemical reaction takes place between the quartz crucible and the Si melt to generate SiO, which is dissolved in the Si melt. A part of the SiO evaporates from the melt and mixes in the atmosphere within the heat chamber, and other part stays in the Si melt.

The Ar gas supplied from the supply source 13 and the SiO gas evaporating from the melt are drawn from the chamber 2 by means of a vacuum pump 18. In an exhaust line 19 connecting the chamber 2 with the vacuum pump 18 is provided a conductance valve 20, which consists of an electrically operated butterfly valve 21 and an electrically operated needle valve 22, the valves 21 and 22 being arranged in parallel. The needle valve 22 is driven by a pulse motor 23 such that its opening is precisely controlled.

Incidentally, it is possible to replace the conductance valve 20 with a single electrically controlled butterfly valve or an electrically controlled ball valve.

A pressure sensor 24 is affixed to the chamber 2 for detecting the internal pressure (lower than the atmospheric pressure) of the chamber 2.

In FIG. 1, reference numeral 25 designates a central processing unit (CPU) 25 which constitutes control means adapted to control the internal pressure of the chamber 2 and/or the Ar gas flow rate by controlling the opening of the MFC 15 and the opening of the needle valve 22 in response to the pressure value detected by the pressure sensor 24 in accordance with a control pattern which is corresponding to the passage of crystal pulling time.

When it is intended to control the pressure in the chamber 2, the pressure value (analog value) detected by the pressure sensor 24 is digitized through an A/D converter 26, and inputted to the CPU 25, which outputs a control signal responsive to the detected pressure value. This control signal is amplified through a pulse amplifier 27, and inputted to the pulse motor 23, which, thereupon, drives the needle valve 22 to control the opening thereof based on the control signal received. As a result, the internal pressure of the chamber 2 is controlled in accordance with the control pattern. When the opening of the needle valve 22 is decreased, the pressure in the chamber 2 increases, and the flow rate of the Ar gas is lowered.

When it is not possible to control the pressure of the chamber 2 by only adjusting the opening degree of the needle valve 22, the opening of the MFC 15 is adjusted to change the Ar flow rate to thereby control the pressure in the chamber 2. The flow rate of Ar gas (analog value) detected by the mass flow controller 15 is digitized through an A/D converter 29, and supplied to the CPU 25 as a feedback. The CPU 25 compares this detected Ar gas flow rate with a reference value for Ar gas flow rate, and generates a control signal (digital signal) based on the result of the comparison. Then, this digital control signal is converted into an analog signal through a D/A converter 30 and inputted to the MFC 15 as a setting input to renew the set value to which the Ar gas flow rate is controlled. When the Ar gas supply rate to the MFC 15 is decreased, the pressure in the chamber 2 is reduced.

The Ar gas flow rate detected by the MFC 15 and the internal pressure of the chamber 2 detected by the pressure sensor 24 are alternatively displayed digitally on the display device 32 by alternating the switch 31.

To pull up the Si single crystal 9 based on the CZ method in the single crystal pulling apparatus 1, lumps of polycrystal silicon having appropriate sizes are charged into the crucible 4, and melted by the heater 6; then the seed crystal 12 connected to the lower end of the wire 11 is lowered until it comes in contact with the Si melt 10 contained in the crucible 4. After the lower end face of the seed crystal 12 is partially melted, the melt temperature is lowered to such an extent that the seed crystal would not be melted any more. Then, the wire carrying the seed crystal is pulled up at a rate, and a single crystal grows on the seed crystal, while the crystal and the melt are counter-rotated with respect to each other. During this operation, Ar gas is supplied to the chamber 2 through the purge tube 8, and this Ar gas and the SiO gas evaporating from the melt are drawn out of the chamber 2 by the vacuum pump 18.

As the single crystal pulling operation proceeds, the melt level shifts downwards relative to the crucible wall, and if the evaporation rate of the dapant Sb is maintained unchanged by keeping the pressure in the chamber 2 at a constant value, as is the case with the conventional procedure, the Sb concentration in the Si melt 10 increases and, as a result, the specific resistance of the as-grown single crystal 9 decreases with the progress of the pulling operation, as shown in FIG. 4 (ref. broken straight line a in FIG. 3, also).

With the view of preventing this phenomenon of gradual decrease in the specific resistance of the single crystal ingot with the growth of the single crystal, experiments were conducted and it was found that when the opening degrees of the needle valve 22 and the mass flow controller 15 were adjusted in accordance with a control pattern which was designed such that the pressure in the chamber 2 was caused to decrease along a curve B in FIG. 2, which was a broken line, as the single crystal pulling operation proceeded, the evaporation rate of Sb increased with time so that the Sb concentration of the melt was reduced and, consequently, due to the relation shown in FIG. 4, the lowering in specific resistance of the single crystal 9 was restrained. In FIG. 3, the result of the actual measurement of the specific resistance is plotted with a symbol X with respect to the proportion of the length of the as-grown crystal to the aimed final length thereof. Compared with the result plotted with the symbol  (which corresponds to the specific resistance measured when the pressure in the chamber 2 was kept constant), the result of the method of the present invention shows a clear improvement in that the lowering of the specific resistance with the lengthening of the single crystal is greatly moderated, if not completely checked.

As described above, it is possible to control the pressure in the chamber 2 in accordance with a control pattern, like that of FIG. 2, stored in the CPU 25, so that it is possible to arbitrarily control the specific resistance of the single crystal ingot 9 after conducting extensive trial operations. Consequently, the specific resistance throughout the whole length of the single crystal 9 can be controlled to be within a tolerable range.

In the above description of the invention, the pressure in the chamber 2 is varied in accordance with a predetermined control pattern by adjusting the opening degrees of the needle valve 22 and the mass flow controller 15; but if a conductance valve is used which has a sufficient sensitivity for covering the region across which the pressure control pattern extends, it is not always necessary to employ the mass flow controller 15 to control the Ar gas flow rate.

In the procedure described above, only the pressure in the chamber 2 is controlled; but it is also possible to regulate the value of the specific resistance within a range throughout the whole length of the single crystal 9 by fixing the pressure in the chamber 2 at a constant value, and increasing under control the Ar gas flow rate alone with the progress of single crystal pulling operation, whereby the evaporation rate of Sb increases with the progress of single crystal pulling operation and, consequently, the lowering of the specific resistance of the single crystal 9 is checked due to the relation shown in FIG. 4. If, as described in the embodiment above, the Ar gas flow rate in addition to the opening degree of the needle valve 22 is controlled in order to obtain improved controlling of the pressure in the chamber 2, a correction to the control pattern (B in FIG. 2) used in the embodiment for the chamber pressure is required because the control pattern is effective only when the Ar gas flow rate is constant.

Incidentally, the control pattern, according to which the changes in the pressure in the chamber 2 and/or the Ar gas flow rate are ruled, is programmed in advance in a storage of the CPU.

So far has been described a procedure for regulating the specific resistance of an as-grown single crystal to a roughly constant value throughout the whole length of the crystal, particularly in the case of a Sb-doped single crystal, by controlling the pressure in the chamber and/or the Ar gas flow rate with respect to the passage of single crystal pulling time. Next, a manner for determining such a control pattern for the chamber pressure and/or the inert gas flow rate will be described in detail.

Let C be the solute concentration within the solidification region in the vicinity of the solid-liquid interface in the silicon melt, $C_0$ the initial solute concentration of the melt, G the proportion of the weight of the grown crystal to the initial weight of the silicon melt, and $K_{Sb}$ the apparent segregation coefficient, Sb being the solute; then the following relation holds:

$$C = C_0 K_{Sb}(1-G)^{K_{Sb}-1} \quad (1)$$

Incidentally, in the case of Sb, which has a relatively high volatility, the concentration of the solute Sb in the silicon melt decreases as the chamber pressure is reduced and/or as the inert gas flow rate in the chamber is increased; and the present inventors confirmed by experiments that the solute concentration decreased more sharply than was expected from the fact that the segregation coefficient is far smaller than 1, and that the apparent segregation coefficient $K_{Sb}$ was greatly affected. Also, they confirmed after quite a few difficult experiments that it is possible to approximate the segregation coefficient $K_{Sb}$ to 1.

Let P represent the pressure in the chamber 2, and F the inert gas flow rate. Through repetition of various mathematical methods as well as experiments, the present inventors discovered that the segregation coefficient $K_{Sb}$ can be given as a function of certain variables, which are, the initial value $P_0$ of the chamber pressure P, the initial value $F_0$ of the inert gas flow rate F, the partial differential of the pressure P by the time t, i.e., $(\partial P/\partial t)_F$ and/or the partial differential of the flow rate F by the time t, i.e., $(\partial F/\partial t)_P$:

$$K_{Sb} = aP_0 + b(\partial P/\partial t)_F + cF_0 + d(\partial F/\partial t)_P + e \quad (2)$$

wherein a, b, c, d and e are empirically obtained coefficients.

Now, by solving the partial differential equation (2) to obtain the partial differential $(\partial P/\partial t)_F$ and/or the partial differential $(\partial F/\partial t)_P$ such that $K_{Sb} \approx 1$, and programming the pressure P and/or the flow rate F with time t, and storing the same in the memory storage of the CPU 25 shown in FIG. 1, then since $C \approx C_0$, it becomes possible to regulate the specific resistance of the single crystal to a roughly constant value throughout the whole length of the single crystal. Incidentally, it has been empirically confirmed that the empirical coefficients a, b, c, d, and e of Equation (2) are independent from each other, so that it is possible to obtain them respectively by means of the known least square approximation method. For example, in the case where the inert gas flow rate F is fixed at a constant value, then, since $(\partial F/\partial t)_P = 0$, Equation (2) is rewritten as follows:

$$K_{Sb} = -7.5 \times 10^{-6} P_0^{1.7} - (\partial P/\partial t)_F - 1.1 \times 10^{-4} F_0 + 1.00 \quad (3)$$

If $P_0 = 50$ millibar, $(\partial P/\partial t)_F = 0.015$, and $F_0 = 70$ Nl/min, then, according to Equation (3), $K_{Sb} = 0.97$, which is approximately one.

(Effects of the Invention)

As is clear from the above description, according to the invention, the pressure in the chamber of a single crystal pulling apparatus and/or the inert gas flow rate is controlled in accordance with a pattern with respect to the passage of single crystal pulling time, so that it is possible to control the evaporation rate of the dopant to thereby prevent thickening of the dopant in the polycrystal melt, and consequently the lowering in the specific resistance with progress of the crystal growing is checked such that the specific resistance is regulated to be within a tolerable range throughout the whole length of the single crystal.

What is claimed is:

1. A method for controlling a specific resistance of a single crystal which is grown in a Czochralski-method type single crystal pulling apparatus having a hermetical chamber in which the single crystal is pulled up from a polycrystal melt and an inert gas supply and exhaust system by means of which an inert gas is supplied to said hermetical chamber and exhausted therefrom; said method being characterized in that the pneumatic pressure in said hermetical chamber and the supply rate of said inert gas are controlled in accordance with a prepared control pattern with respect to the passage of pulling time, wherein said prepared control pattern is obtained by first solving the following partial differential equation for $(\partial P/\partial t)_F$ and $(\partial F/\partial t)_P$ such that $K_{Sb} = 1$:

$$K_{Sb} = aP_0 + b(\partial P/\partial t)_F + cF_0 + d(\partial F/\partial t)_P + e$$

wherein a, b, c, d, and e are empirically obtained coefficients, P is the pressure in said chamber, F the inert gas flow rate, t the time passage of the pulling operation, $K_{Sb}$ the segregation coefficient of a Sb dopant in the silicon melt, $P_0$ the initial value of said chamber pressure P, $F_0$ the initial value of said inert gas flow rate F; then, programming the values of the pneumatic pressure P in said chamber and the inert gas flow rate F with respect to the time passage t of the pulling operation.

2. The method as claimed in claim 1, wherein said prepared control pattern is such that the pneumatic pressure in said hermetical chamber is varied while the supply rate of said inert gas is kept unchanged.

3. The method as claimed in claim 1, wherein said prepared control pattern is such that the supply rate of said inert gas is varied while the pneumatic pressure in said hermetical chamber is kept unchanged.

4. A method for controlling a specific resistance of a single crystal which is grown in a Czochralski-method type single crystal pulling apparatus having a hermetical chamber in which the single crystal is pulled up from a polycrystal melt and an inert gas supply and exhaust system by means of which an inert gas is supplied to said hermetical chamber and exhausted therefrom; said method being characterized in that the pneumatic pressure in said hermetical chamber and the supply rate of said inert gas are controlled ion accordance with a prepared control pattern with respect to the passage of pulling time, wherein said prepared control pattern is obtained by first solving the following partial differential equation for $(\partial P/\partial t)_F$ such that $K_{Sb} \approx 1$:

$$K_{Sb}=aP_0+b(\partial P/\partial t)_F+cF_0+e$$

wherein a, c, and e are empirically obtained coefficients, P is the pressure in said chamber, F the inert gas flow rate, t the time passage of the pulling operation, $K_{Sb}$ the segregation coefficient of a Sb dopant in the silicon melt, $P_0$ the initial value of said chamber pressure P, $F_0$ the initial value of said inert gas flow rate F; then, programming the value of the pneumatic pressure P in said chamber with respect to the time passage t of the pulling operation.

5. A method for controlling a specific resistance of a single crystal which is grown in a Czochralski-method type single crystal pulling apparatus having a hermetical chamber in which the single crystal is pulled up from a polycrystal melt and an inert gas supply and exhaust system by means of which an inert gas is supplied to said hermetical chamber and exhausted therefrom; said method being characterized in that the pneumatic pressure in said hermetical chamber and the supply rate of said inert gas are controlled ion accordance with a prepared control pattern with respect to the passage of pulling time, wherein said prepared control pattern is obtained by first solving the following partial differential equation for $(\partial F/\partial t)_P$ such that $K_{Sb}\approx 1$:

$$K_{Sb}=aP_0+cF_0+d(\partial F/\partial t)_P+e$$

wherein a, b, c, d, and e are empirically obtained coefficients, P is the pressure in said chamber, F the inert gas flow rate, t the time passage of the pulling operation, $K_{Sb}$ the segregation coefficient of a Sb dopant in the silicon melt, $P_0$ the initial value of said chamber pressure P, $F_0$ the initial value of said inert gas flow rate F; then, programming the value of the inert gas flow rate F with respect to the time passage t of the pulling operation.

6. An apparatus for controlling the specific resistance of a single crystal which is grown in a Czochralski-method type single crystal pulling apparatus having:
- a hermetical chamber in which a single crystal is pulled up from a polycrystal melt;
- an inert gas system including an inert gas supply source, an inert gas supply passage via which said inert gas supply source communicates with said chamber, an inert gas exhaust passage, and a vacuum pump by means of which an inert gas is supplied to said hermetical chamber and exhausted therefrom; said apparatus being characterized by comprising:
- a flow rate control means provided across said inert gas supply passage for controlling the supply rate of said inert gas to said hermetical chamber;
- a control valve means provided across said exhaust passage via which said chamber communicates with said vacuum pump, for controlling the pressure in said hermetical chamber;
- a pressure sensor for detecting the pressure in said hermetical chamber;
- a central processing unit for controlling said control valve means and said flow rate control means responsive to the pressure detected by said pressure sensor in a manner such that the pressure in the chamber and the inert gas flow rate are controlled in accordance with a prepared control pattern with the respect to the passage of pulling time, including means for determining said pressure and said inert gas flow rate during pulling time of said single crystal ingot from a melt by solving the following partial differential equation for $(\partial P/\partial t)_F$ and $(\partial F/\partial t)_P$ such that $K_{Sb}\approx 1$:

$$K_{Sb}=aP_0+b(\partial P/\partial t)_P+cF_0+d(\partial F/\partial t)_P+e$$

where a, b, c, d, e are empirically obtained coefficients, P is the pressure in said chamber, F the inert gas flow rate, t is the time passage of the pulling operation, $K_{Sb}$ the segregation coefficient of a Sb dopant in the silicon melt, $P_o$ the initial value of said chamber pressure P, and $F_o$ the initial value of said inert gas flow rate F.

7. The apparatus as claimed in claim 6 wherein said control valve means is a conductance valve.

8. The apparatus as claimed in claim 7 wherein said conductance valve includes an electrically operated needle valve.

9. An apparatus for controlling the specific resistance of a single crystal which is grown in a Czocharalski-method type single crystal pulling apparatus having:
- a hermetical chamber in which a single crystal is pulled up from a polycrystal melt;
- an inert gas system including an inert gas supply source, an inert gas supply passage via which said inert gas supply source communicates with said chamber, an inert gas exhaust passage, and a vacuum pump by means of which an inert gas is supplied to said hermetical chamber and exhausted therefrom; said apparatus being characterized by comprising:
- a flow rate control means provided across said inert gas supply passage for controlling the supply rate of said inert gas to said hermetical chamber;
- a control valve means provided across said exhaust passage via which said chamber communicates with said vacuum pump, for controlling the pressure in said hermetical chamber;
- a pressure sensor for detecting the pressure in said hermetical chamber;
- a central processing unit for controlling said control valve means and said flow rate control means responsive to the pressure detected by said pressure sensor in a manner such that the pressure in the chamber and the inert gas flow rate are controlled in accordance with a prepared control pattern with the respect to the passage of pulling time, including means for determining said pressure and said inert gas flow rate during pulling time of said single crystal ingot from a melt by solving the following partial differential equation for $(\partial P/\partial t)_F$ such that $K_{Sb}\approx 1$:

$$K_{Sb}=aP_o+b(\partial P/\partial t)_F+cF_o+e$$

wherein a, b, c, e are empirically obtained coefficients, P is the pressure in said chamber, F the inert gas flow rate, t the time passage of the pulling operation, $K_{Sb}$ the segregation coefficient of a Sb dopant in the silicon melt, $P_O$ the initial value of said chamber pressure P, $F_O$ the initial value of said inert gas flow rate F.

10. An apparatus as recited in claim 9, wherein said control valve means is a conductance valve.

11. An apparatus as recited in claim 10, wherein said conductance valve is a needle valve.

12. An apparatus for controlling the specific resistance of a single crystal which is grown in a Czochralski-method type single crystal pulling apparatus having:
- a hermetical chamber in which a single crystal is pulled up from a polycrystal melt;

an inert gas system including an inert gas supply source, an inert gas supply passage via which said inert gas supply source communicates with said chamber, an inert gas exhaust passage, and a vacuum pump by means of which an inert gas is supplied to said hermetical chamber and exhausted therefrom; said apparatus being characterized by comprising:

a flow rate control means provided across said inert gas supply passage for controlling the supply rate of said inert gas to said hermetical chamber;

a control valve means provided across said exhaust passage via which said chamber communicates with said vacuum pump, for controlling the pressure in said hermetical chamber;

a pressure sensor for detecting the pressure in said hermetical chamber;

a central processing unit for controlling said control valve means and said flow rate control means responsive to the pressure detected by said pressure sensor in a manner such that the pressure in the chamber and the inert gas flow rate are controlled in accordance with a prepared control pattern with respect to the passage of pulling time, including means for determining said pressure and said inert gas flow rate during pulling time of said single crystal ingot from a melt by solving the following partial differential equation for $(\partial F/\partial t)_P$ such that $K_{Sb} \approx 1$:

$$K_{Sb} = aP_O + cF_O + d(\partial F/\partial t)_P + e.$$

wherein a, c, d, e are empirically obtained coefficients, P is the pressure in said chamber, F the inert gas flow rate, t the time passage of the pulling operation, $K_{Sb}$ the segregation coefficient of a Sb dopant in the silicon melt, $P_O$ the initial value of said inert gas flow rate F; then, programming the value of the insert gas flow rate F with respect to the time passage t of the pulling operation.

13. An apparatus as recited in claim 12, wherein said control valve means is a conductance valve.

14. An apparatus as recited in claim 13, wherein said conductance valve is a needle valve.

15. The method as claimed in claim 4, wherein said prepared control pattern is such that the pneumatic pressure in said hermetical chamber is varied while said supply rate of said inert gas is kept unchanged.

16. The method as claimed in claim 4, wherein said prepared control pattern is such that the supply rate of said inert gas is varied while said pneumatic pressure in said hermetical chamber is kept unchanged.

17. The method as claimed in claim 5, wherein said prepared control pattern is such that the pneumatic pressure in said hermetical chamber is varied while said supply rate of said inert gas is kept unchanged.

18. The method as claimed in claim 5, wherein said prepared control pattern is such that the supply rate of said inert gas is varied while said pneumatic pressure in said hermetical chamber is kept unchanged.

* * * * *